(12) United States Patent
Chee

(10) Patent No.: US 6,774,471 B2
(45) Date of Patent: Aug. 10, 2004

(54) PROTECTED BOND FINGERS

(75) Inventor: Choong Kooi Chee, Penang (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/135,547

(22) Filed: Apr. 30, 2002

(65) Prior Publication Data

US 2003/0203542 A1 Oct. 30, 2003

(51) Int. Cl.⁷ .............................................. H01I 23/02
(52) U.S. Cl. ..................... 257/685; 257/686; 257/723; 257/773; 257/789
(58) Field of Search .................................. 257/685, 686, 257/723, 724, 725, 773, 776, 777, 787, 788, 789

(56) References Cited

U.S. PATENT DOCUMENTS

| | | | | |
|---|---|---|---|---|
| 5,220,200 A | * | 6/1993 | Blanton | 257/778 |
| 5,672,913 A | * | 9/1997 | Baldwin et al. | 257/737 |
| 6,498,054 B1 | * | 12/2002 | Chiu et al. | 438/108 |
| 6,531,784 B1 | * | 3/2003 | Shim et al. | 257/777 |
| 6,555,917 B1 | * | 4/2003 | Heo | 257/777 |
| 6,589,709 B1 | * | 7/2003 | Okoroanyanwu et al. | 438/109 |

* cited by examiner

Primary Examiner—Kevin M. Picardat
(74) Attorney, Agent, or Firm—John F. Travis

(57) ABSTRACT

A package substrate having a finger projection that is either an elevated or removably covered bond finger. The finger portion includes a portion to remain uncovered by a die and an underfill material when the package substrate is coupled to the die. A second portion of the finger projection may allow the first portion to remain uncovered as indicated.

23 Claims, 11 Drawing Sheets

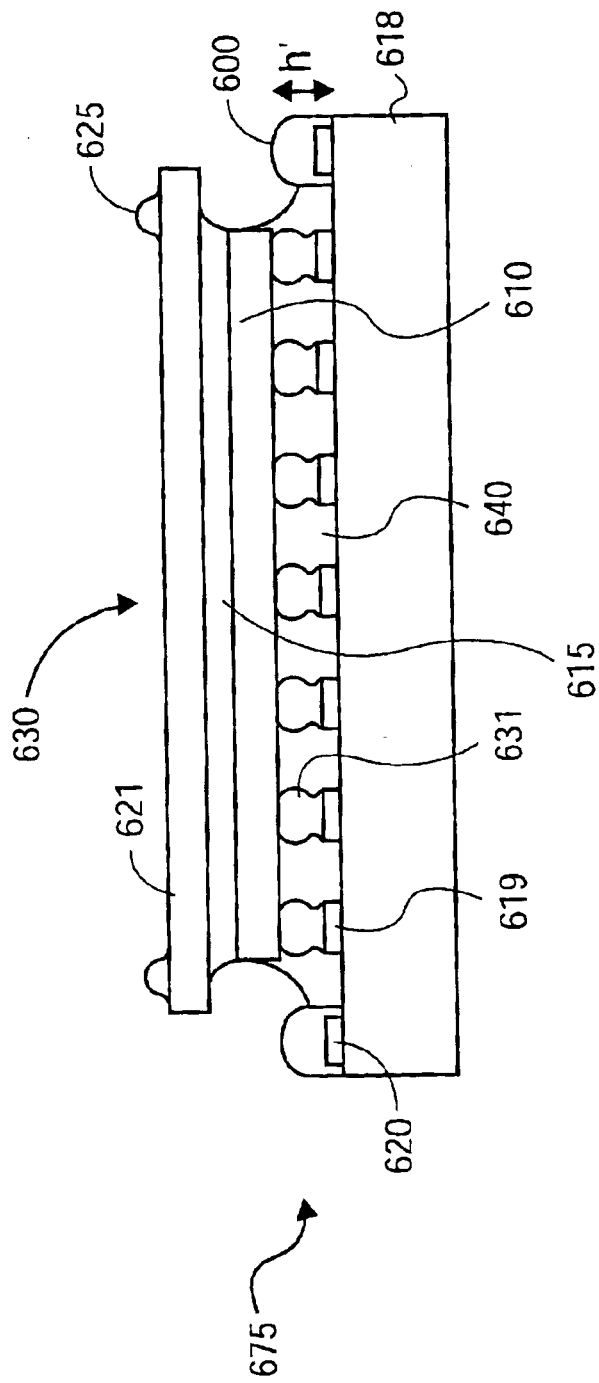

PROTECTED BOND FINGERS

BACKGROUND

Embodiments described relate to die attachment to a package substrate. In particular, embodiments described herein relate to a semiconductor package which includes a package substrate having a surface to accommodate stacked dice.

BACKGROUND OF THE RELATED ART

In the fabrication of microchips or dice, semiconductor wafers are processed and sliced into individual dice. The dice may then be used in a wide variety of devices. For example, a die may be used in an electronic device by being electronically coupled to a printed circuit board (PCB) of the device. However, prior to such an electronic coupling, packaging takes place. Packaging is the manner by which a semiconductor wafer is separated into individual dice that are then protected in various package forms. The protective packages prevent damage to the die and provide an electrical path to the circuitry of the die.

The package includes a protective package substrate having a surface to which the die is secured and electronically coupled. In many cases a second die, positioned above the first die and secured thereto, is also electronically coupled to the package substrate. The resulting semiconductor package is often referred to as being of a "stacked" configuration.

The stacked dice are secured to the package substrate by first aligning metal bumps of the first die above bond pads at the surface of the package substrate. The metal bumps and bond pads are soldered to one another to provide electronic coupling. An underfill material, generally an epoxy adhesive, is then applied, in liquid form, between the first die and the surface of the package substrate, filling the space there between. The underfill material is then cured to secure and stabilize the first die to the substrate. The second die of the stacked configuration has been similarly secured to the first die. For example, an epoxy or other adhesive material may be used to secure a lower surface of the second die to the first die.

Electrical coupling may then be provided between metal bumps, referred to here as metal contacts, at an upper surface of the second die and certain bond pads at the surface of the substrate. This is accomplished by wire bonding. For example, metal wires, often of gold, are ran from the metal bumps of the second die to the certain bond pads at the surface of the substrate. The certain bond pads at the surface of the substrate to couple to the second die are referred to here as bond fingers. The bond fingers are bond pads that are not aligned below the first die and have not been coupled to the metal bumps of the first die. Rather, they are adjacent the other bond pads at the surface of the substrate, to be left available for wire bonding to the metal contacts of the second die. However, as described below, dispensing underfill material to secure the first die to the substrate, may interfere with the coupling of the bond fingers to the metal contacts of the second die.

Dispensing of underfill material is accomplished by a heated dispensing needle. The dispensing needle is positioned to deliver underfill material between the first die and the package substrate. The exact position of the needle may greatly affect the resulting performance of the first die. For example, if the first die is contacted by the dispensing needle, it may be severely damaged. On the other hand, the further the needle is from the first die, the less control is maintained over the spreading or flow of the underfill material. Additionally, the degree of precision required in delivering underfill material becomes more and more difficult to attain with complete accuracy, especially as packaging dimensions continue to diminish in size. However, it is important that the bond fingers remain free of underfill material for subsequent wire bonding to the metal contacts of the second die.

BRIEF DESCRIPTION OF THE DRAWINGS

FIG. 6A is a side view of an alternate embodiment of a semiconductor package having covered bond fingers.

DETAILED DESCRIPTION

Descriptions of package substrate embodiments follow. In particular, embodiments of package substrates with elevated or removably covered bond fingers are described. The bond fingers are protected from coverage by underfill material in the formation of a stacked semiconductor package. Particular embodiments are described with reference to the accompanying drawings. However, additional features and modifications are also within the scope of the embodiments described below.

Embodiments described below include a package substrate that may be coupled to a first die and a second die. The package substrate may be coupled to the second die by way of bond fingers that are protected from underfill coverage as the package substrate is initially coupled to the first die. While embodiments are described with reference to particular stacked semiconductor packages, the embodiments are applicable to any bond finger including a portion to be isolated from or left uncovered by underfill material following certain semiconductor processing.

Figure 1:
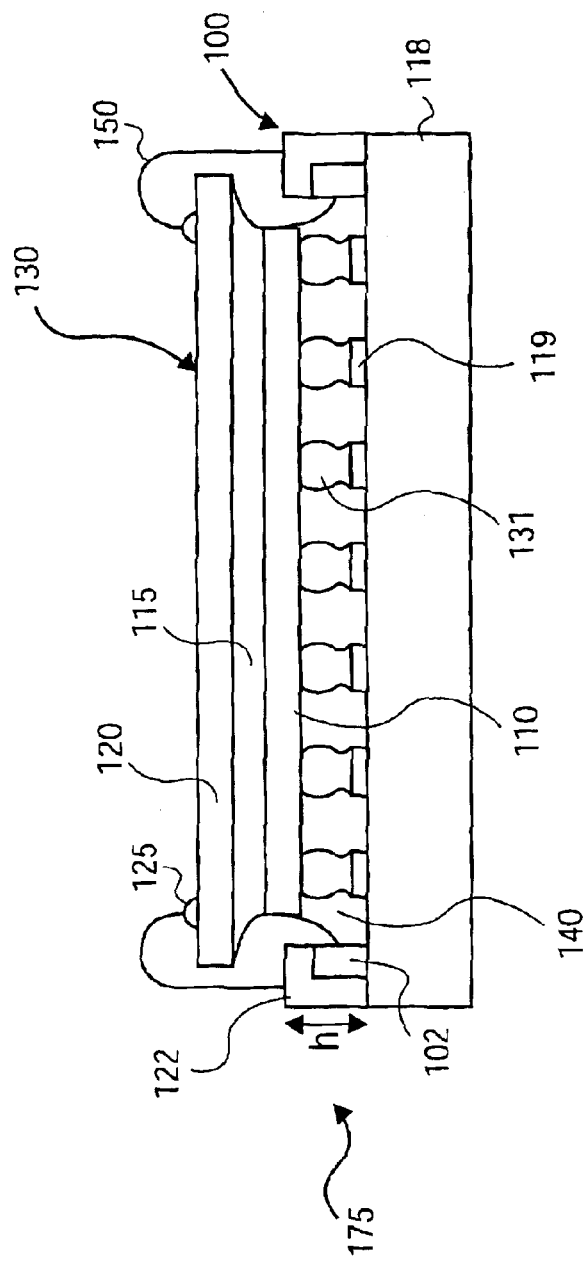
FIG. 1 is a side view of an embodiment of a semiconductor package having elevated bond fingers wire bonded to stacked dice.

Referring now to FIG. 1, an embodiment of a semiconductor package 175 utilizing elevated bond fingers 100 is shown. As described further herein, the elevated bond fingers 100 are of a height (h) sufficient to prevent coverage by underfill material 140 as a lower die 110 is secured to the package substrate 118 supporting the elevated bond fingers 100. The height (h) may be provided by placement of a molded column 102 supporting the build-up of metal portions 122. In this manner, the elevated bond fingers 100 remain free for coupling to an upper die 120 (e.g. at metal portions 122).

In the embodiment shown in FIG. 1, the upper 120 and lower 110 dice are secured to one another by an adhesive interface material 115 to form a stacked dice assembly 130. However, it is not required that the dice 110, 120 be of a single assembly.

Figure 2:
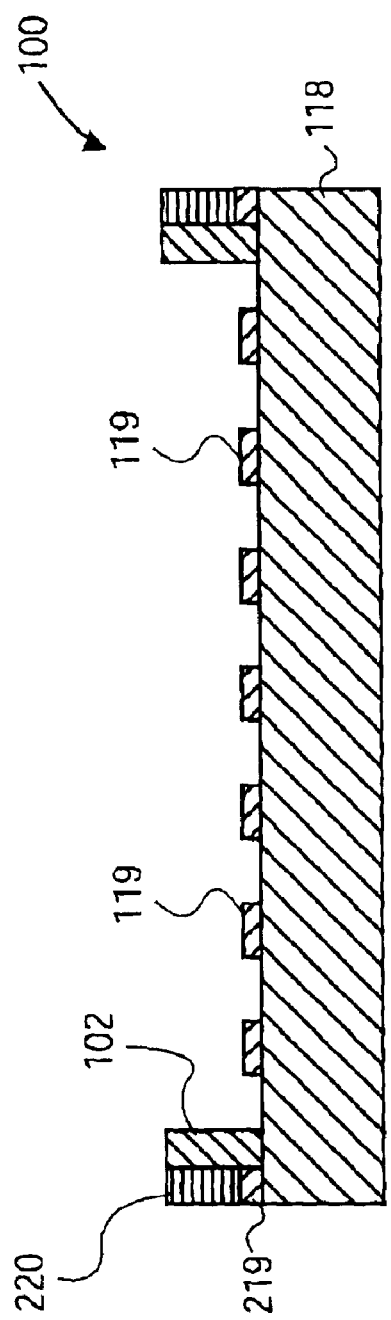
FIG. 2 is a side cross-sectional view of a package substrate having molded columns to form elevated bond fingers.
Figure 3:
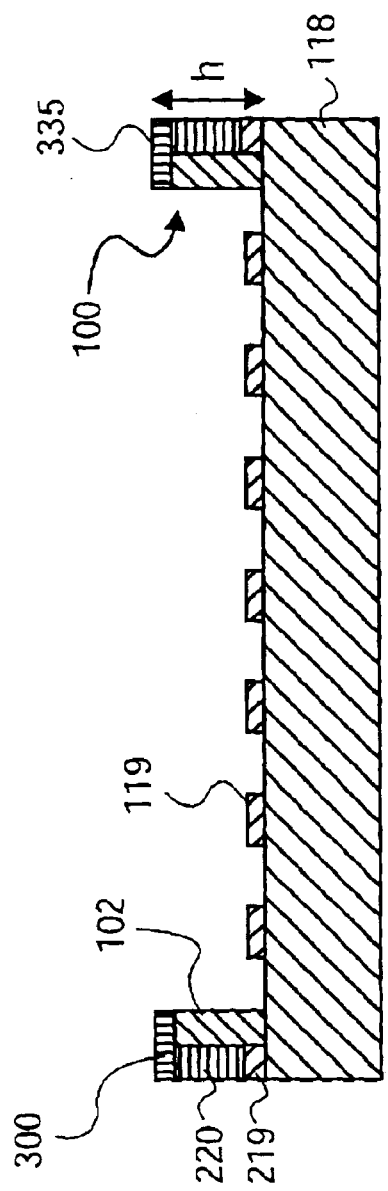
FIG. 3 is a side cross-sectional view of the package substrate of FIG. 2 having elevated bond fingers.

Additionally, the elevated bond fingers 100 include metal portions 122 which may include initial bond fingers 219, elevated bond portions 220 and metal caps 300 (see FIGS. 2 and 3). The metal portions 122 are electronically coupled to the upper die 120 at metal contacts 125 by way of metal wire 150. The metal wire 150 may be of gold. However, other forms of electronic coupling may be employed.

Similarly, metal bumps 131 of the lower die 110 are soldered to bond pads 119 of the package substrate 118. However, other forms of electronic coupling between the package substrate 118 and the lower die 110 may also be employed.

FIGS. 2–5 described below, detail a manner by which elevated bond fingers 100 may be formed and employed in a semiconductor package 175 such as that shown in FIG. 1. However, a variety of parameters, largely a matter of design choice, are available to choose from in forming elevated bond fingers 100.

Referring now to FIG. 2, an embodiment of a package substrate 118 is shown in cross-section. The package substrate 118 may have multiple layers of circuitry isolated by inter-layer dielectric (ILD) material. A core material of fiber-reinforced epoxy, copper clad, or other conventional material may be used to form much of the package substrate 118. In the embodiment shown, the package substrate 118 is subjected to a photolithographic and metalization process, similar to that described below, to form bond pads 119 and initial bond fingers 219.

The package substrate 118 makes up the bulk of packaging acting as a protective interface between a die and an external device such as a printed circuit board (PCB). The package substrate 118 includes bond pads 119 which may couple to a die as described further herein. The package substrate 118 also supports initial bond fingers 219 for coupling to another external device such as another die as also described further herein.

The bond pads 119 and initial bond fingers 219 are distinguished from one another depending on intended electronic coupling described further herein. The bond pads 119 and initial bond fingers 219 may be of a metal based nickel-gold, copper, titanium or other suitable material. The bond pads 119 and initial bond fingers 219 may also be electronically coupled to inner circuitry within the package substrate 118. Additionally, the inner circuitry of the package substrate 118 may terminate at a surface opposite the bond pads 119 and initial bond fingers 219 for coupling to another external device such as a PCB. In this manner, a die coupled to the bond pads 119 or initial bond fingers 219 is protected by packaging while being electronically accessible to the PCB that is also coupled to the package substrate 118.

The embodiment shown in FIG. 2 includes molded columns 200 placed vertically adjacent initial bond fingers 219 at the surface of the package substrate 110. The molded columns 200 may be of epoxy, or other material suitable for semiconductor processing, and placed by conventional extrusion techniques. A resist is then placed on the package substrate 118 to direct deposition of a metal to a surface of the initial bond fingers 219 to elevate the initial bond fingers 219. The resist may be an epoxy anhydride while the metal deposited may include a nickel-gold, copper, titanium or other suitable deposition material. The deposition described here forms elevated bond portions 220.

The elevated bond portions 220 described above may be formed in a metalization reactor which may be a conventional chemical vapor deposition (CVD) apparatus. The CVD apparatus may be plasma enhanced (i.e. a PECVD apparatus) and operated by conventional means. Once the package substrate 118 is positioned and the PECVD apparatus sealed, a metal for deposition is introduced into the apparatus in vapor form. Simultaneously, radio frequency (RF) is applied through the PECVD apparatus such that the metal is excited to a plasma state to cause deposition at exposed portions of the package substrate 118. In the embodiment shown, a resist leaves only the metal surfaces of the initial bond fingers 219 exposed. In this manner, deposition is prevented on other metal features of the package substrate 118, such as the bond pads 119.

The process described above may proceed at conventional pressures, temperatures, RF and power. For example, in one embodiment, pressure is maintained between about 2.0 Torr and about 10.0 Torr, preferably between about 3.0 Torr and about 6.0 Torr, and a temperature is maintained between about 250° C. and about 450° C. Additionally, RF is maintained at standard frequencies and between about 1,600 watts and about 1,800 watts are supplied.

Referring to FIGS. 2 and 3, the package substrate 118 is shown with elevated bond portions 220 formed against the molded fingers 200 by the metalization described above. The package substrate 118 may be subjected to further metalization in the manner described above. As shown in FIG. 3, additional metalization completes the formation of the elevated bond fingers 100 and ensures that the entire surface 335 of each elevated bond finger 100 is electrically conductive by the addition of a metal cap 300. The additional metalization may also provide a completed height (h) or overall profile to the elevated bond fingers 100.

Referring to FIG. 3, the metal cap 300 is formed by placement of a resist, leaving only the surfaces of the molded fingers 200 and elevated bond portions 220 exposed. Again, the resist may be of an epoxy anhydride or other suitable material and the metalization may proceed in a metalization reactor which may be a PECVD apparatus operated by conventional means. Again, the metal caps 300 may be formed from nickel-gold, copper, titanium or other suitable material.

Figure 4:
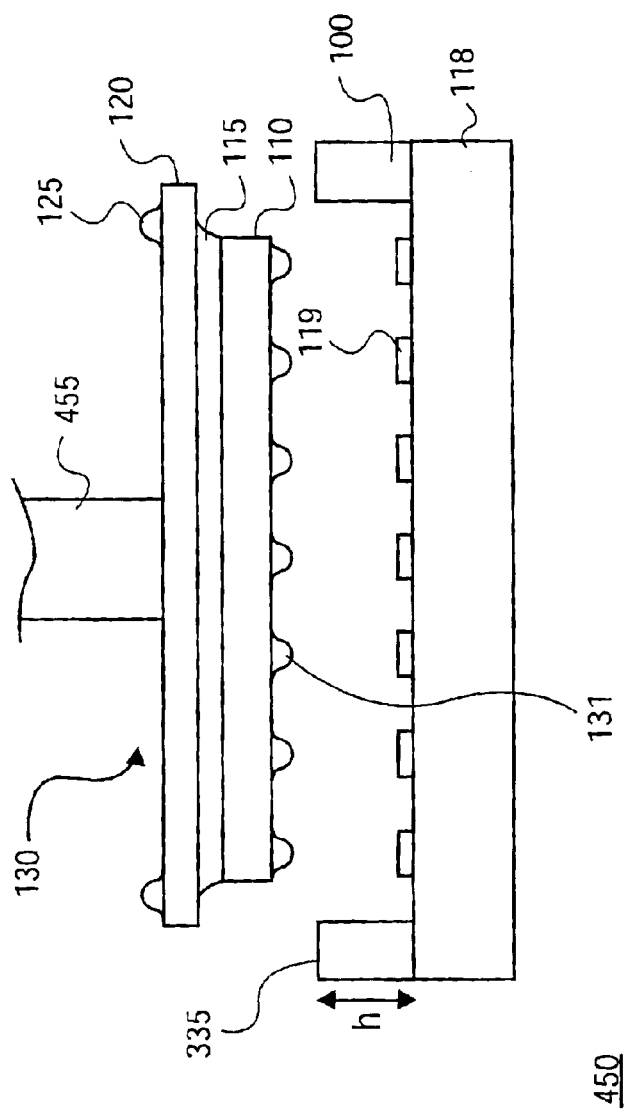
FIG. 4 is a side view of the package substrate of FIG. 3 to receive stacked dice and form a semiconductor package.

Referring to FIG. 4, the package substrate 118 is removed from the metalization reactor. The package substrate 118 is shown with elevated bond fingers of a given height (h). The package substrate 118 is placed in a pick and place device 450 where an arm 455 delivers stacked dice 130. A surface of the stacked dice 130 includes metal bumps 131 to align and couple to the bond pads 119 of the package substrate 118. The aligning of the metal bumps 131 and the bond pads 119 prevents the surface of the package substrate 118 from contacting the surface of the stacked dice 130. In this manner, a distance (d) (see FIG. 5) will separate the package substrate 118 and the surface of the stacked dice 130. As described further herein, the height (h) of the elevated bond fingers 100 may extend to at least about the distance (d) in order to keep the surface 335 devoid of any underfill material 140 (see FIG. 5). In one embodiment, the elevated bond fingers are between about 50 microns and about 250 microns in height (h).

Continuing with reference to FIG. 4, the stacked dice 130 include a lower die 110 and an upper die 120 having generally independent circuitry. The lower die 110 accommodates the metal bumps 131 referenced above and is coupled to the upper die 120 through an adhesive interface material 115. The adhesive interface material 115 may include a conventional epoxy. Metal contacts 125 are located at an upper surface of the upper die 120. The metal contacts 125 are similar to the metal bumps 131. However, they do not directly couple to the package substrate 118. Rather, the metal contacts 125 require wire bonding, or some other means to electrically couple to the package substrate 118 as described further below. The metal contacts 125 of the upper die 120 and the metal bumps 131 of the lower die 110 may be of tin, tin lead or other conventional solder material.

Once the stacked dice 130 are delivered to the package substrate 118, conventional soldering is used to electrically couple the bond pads 119 and the metal bumps 131. In this manner, a semiconductor package 175, as shown in FIG. 5, is formed.

Figure 5:
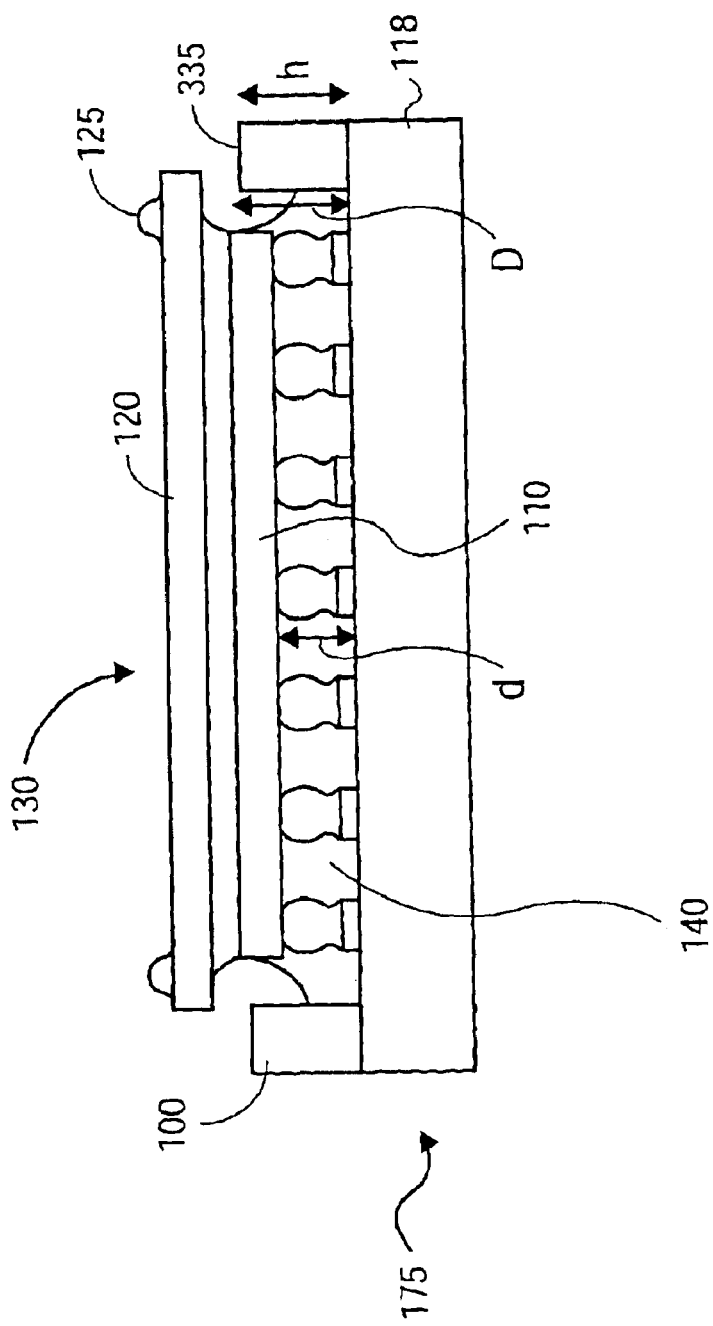
FIG. 5 is a side view of the semiconductor package of FIG. 4 placed within a curing apparatus.

Referring to FIG. 5, the semiconductor package 175 is shown with an underfill material 140 delivered to the space between the package substrate 118 and the lower die 110. The underfill material 140 fills this space and surrounds the electrically coupled bond pads 119 and metal bumps 131. Embodiments of underfill material 140 may include conventional epoxy adhesives such as an anhydride, novolac or other epoxy. Additionally, the underfill material 140 may be delivered by a heated dispensing needle precisely positioned at the space between the package substrate 118 and the stacked dice 130. As described below, the underfill material 140 is cured to physically secure the stacked dice 130 to the package substrate 118.

A portion of each elevated bond finger 100 is to be coupled to a metal contact 125 of the upper die 120. In order to couple to the metal contacts 125, a portion of each elevated bond finger 100 is left void of underfill material 140. For example, in one embodiment, the surface 335 of the elevated bond finger 100 is left substantially void of underfill material 140 to allow coupling, by way of wire bonding, to the metal contacts 125.

Ensuring that a portion of each elevated bond finger 100 remains void of underfill material 140 may be accomplished by the formation of elevated bond fingers 100, at least a portion of which is of a height (h) that is as great as the distance (d). Such elevated bond fingers 100 are formed according to processes described above. Proper underfill material 140 delivery will not substantially cover features, such as the elevated bond fingers 100, which are not below the stacked dice 130 and of a profile that meets or exceeds the distance (d) between the package substrate 118 and the underside of the lower die 110. This is because, with the possible exception of locations at the side of the lower die 110, the underfill material 140 will not form a profile that is higher than the distance (d), thus, substantially preventing its coverage of elevated bond fingers 100 of a height (h) as described. Embodiments include a distance (d) from about 50 microns to about 100 microns with the elevated bond fingers 100 being of a height (h) at least about the distance (d) as described above.

Continuing with reference to FIG. 4, the semiconductor package 175 is subjected to curing in a curing apparatus. The curing apparatus may be a conventional semiconductor bake oven to provide RF, microwave, or other forms of radiation to the semiconductor package 175. In one embodiment, curing is activated by heating the curing apparatus and advancing the semiconductor package 175 along a conveyor belt of the curing apparatus. The exact heating and rate of advancement of the semiconductor package 175 is a matter of design choice depending on the particular curing requirements of the underfill material 140 used. For example, in one embodiment, a conventional underfill material 140 is used which fully cures when exposed to a temperature of between about 160° C. and about 180° C. for between about 1.5 hours and about 3.5 hours. Examples of such underfill materials 140 may include an anhydride or novolac epoxy as noted above. However, other types of underfill material 140 may also be used.

Following curing, the semiconductor package 175 as shown in FIG. 1 may be completed. The semiconductor package 175 is shown in FIG. 1 with electrical coupling between the elevated bond fingers 100 and the metal contacts 125 of the upper die 120. In the embodiment shown, wire bonding takes place, wherein wires 150 are soldered to the metal contacts 125 and the elevated bond fingers 100 to provide electrical coupling there between. The wires 150 may be of gold or other suitable material.

The completed semiconductor package 175 shown in FIG. 1 reveals bond fingers 100 having portions devoid of underfill material 140. This is because, in the embodiment shown, the height (h) of the elevated bond portions 100 places an upper surface (e.g. the surface 335 shown in FIG. 3) above adjacent underfill material 140. Additionally, as shown in FIG. 2, the positioning of the molded columns 200 serves as a protective interface between metal portions of the elevated bond fingers 100 and the subsequently delivered underfill material 140 (see also FIG. 1).

While the embodiments described above include coupling a surface of an elevated bond finger 100 to a metal contact 120, this is not required. That is, as long as any portion of the elevated bond finger 100, such as the molded columns 200, is of a sufficient height (h) such as the distance (d) (or the distance (D) as described below), remaining metal portions of the elevated bond finger 100 may be protected enough to allow coupling thereto. For example, in alternate embodiments, the metal contacts 125 are coupled to the elevated bond portions 220 or the initial bond fingers 119 and no uniformly shaped elevated bond finger 100 is required.

Continuing with reference to FIG. 5, an alternate embodiment is described. As noted above, locations immediately at the side of the lower die 110 may accommodate a degree of underfill material 140 buildup. Coverage of the elevated bond finger 100 with this portion of the underfill material 140 may be avoided by placing the elevated bond fingers 100 at a location that is not immediately at the side of the lower die 110. This would correspond to the location of the initial bond fingers 119 as shown in FIG. 1. Subsequently, the elevated bond fingers 100 may be formed as described above.

As an added measure, in an alternate embodiment, the elevated bond fingers 100 are of a height (h) that is at least about a distance (D) from an upper surface of the lower die 110 to the surface of the package substrate 118. In this manner, should an elevated bond finger 100 be located so close to the side of the lower die 110 that it may contact underfill material 140 thereat, it will remain substantially uncovered thereby, due to having a profile that meets or exceeds that of the lower die 110 as measured from the surface of the package substrate 118 to the upper surface of the lower die 110. Because the underfill material 140 does not exceed the distance (D) in profile, even immediately at the side of the lower die 110, it does not reach a profile capable of covering elevated bond fingers 100 that are of a height (h) that is at least about the distance (D). This is the case even if the elevated bond fingers 100 are located immediately at the side of the lower die 110 as noted. Embodiments include a distance (D) from about 150 microns to about 250 microns with the elevated bond fingers 100 being of a height (h) at least about the distance (D) as described above.

Figure 6B:
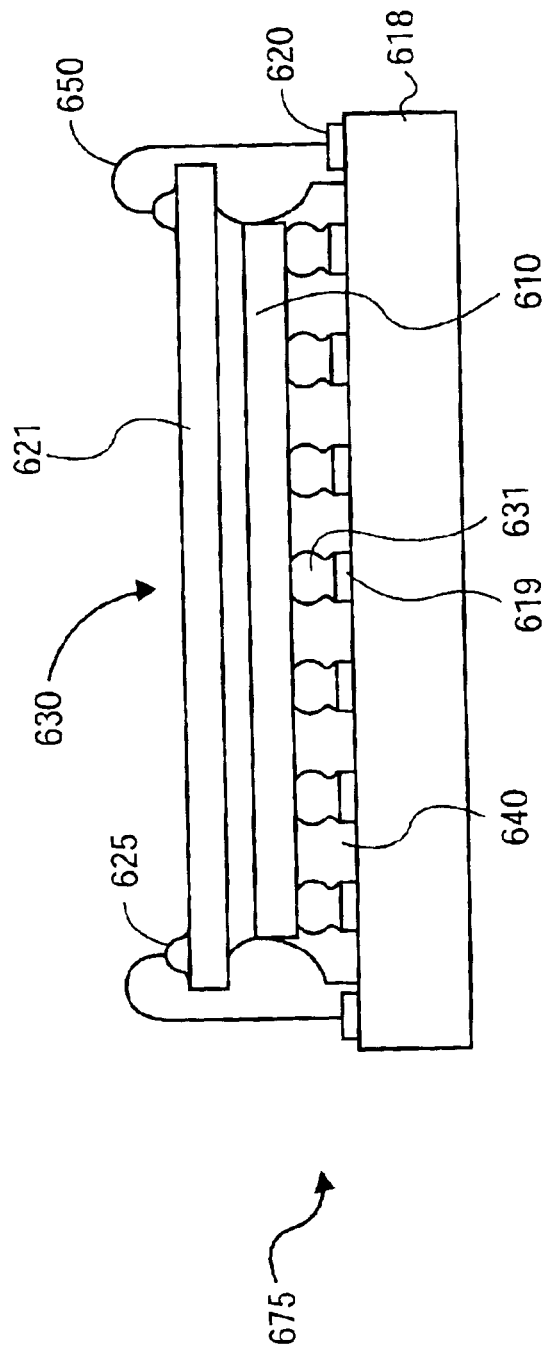
FIG. 6B is a side view of the semiconductor package of FIG. 6A having uncovered bond fingers wire bonded to stacked dice.

Referring to FIGS. 6A and 6B, an alternate embodiment is described where bond fingers 620 are protected by a removable cover 600 (see FIG. 6A). The removable cover 600 prevents underfill 640 from covering the bond fingers 620. Therefore, the bond fingers 620 may be coupled to metal contacts 625 of an upper die 621 once the underfill material 640 cures and the removable covers 600 are removed (e.g. as shown in FIG. 6B).

As in the embodiment shown in FIG. 1, particular features associated with a stacked dice 630 semiconductor package 675 configuration are not necessarily required. For example, FIGS. 6A and 6B reveal upper 621 and lower 610 die with adhesive interface material 615 therebetween along with particular electronic coupling between the dice 610, 621 and package substrate 618. However, again, a variety of parameters, largely a matter of design choice, are available to choose from in forming and removing the removable cover 600 for coupling of the bond fingers 620 to a die (e.g. such as upper die 621).

Figure 7:
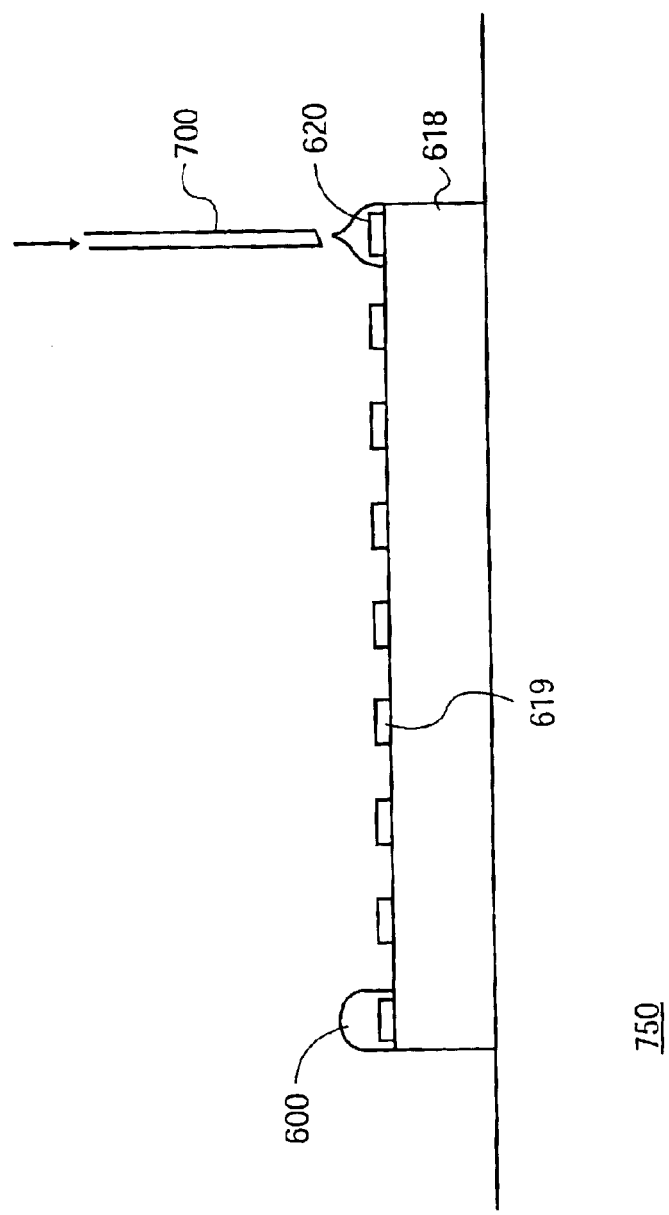
FIG. 7 is a side view of a package substrate having a covered bond finger.
Figure 8:
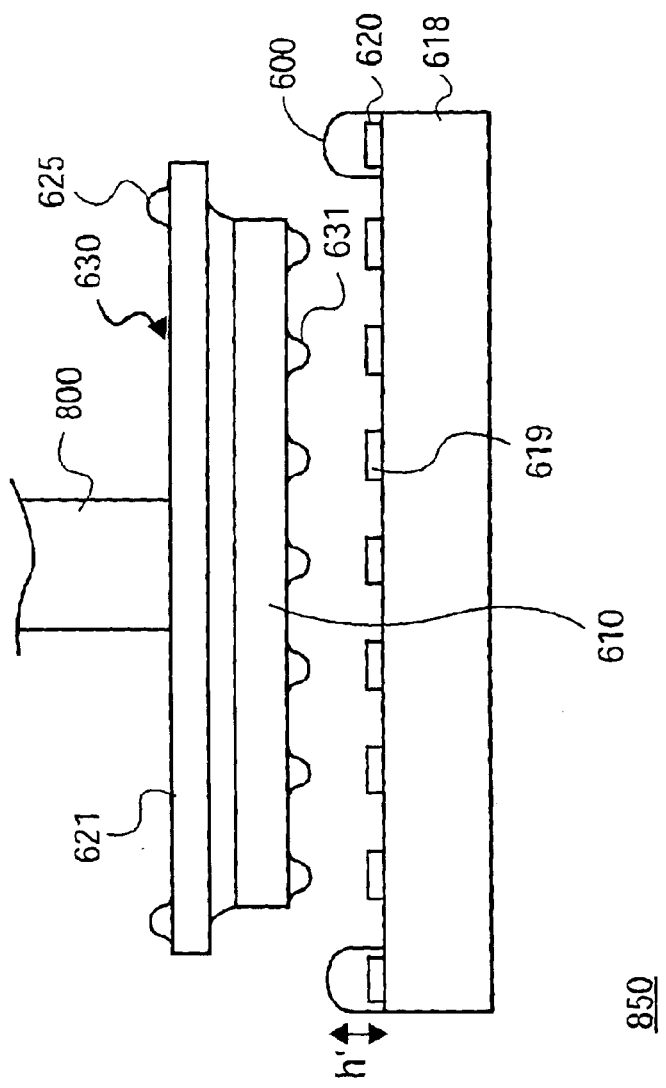
FIG. 8 is a side view of the package substrate of FIG. 6 to receive stacked dice and form a semiconductor package.
Figure 9:
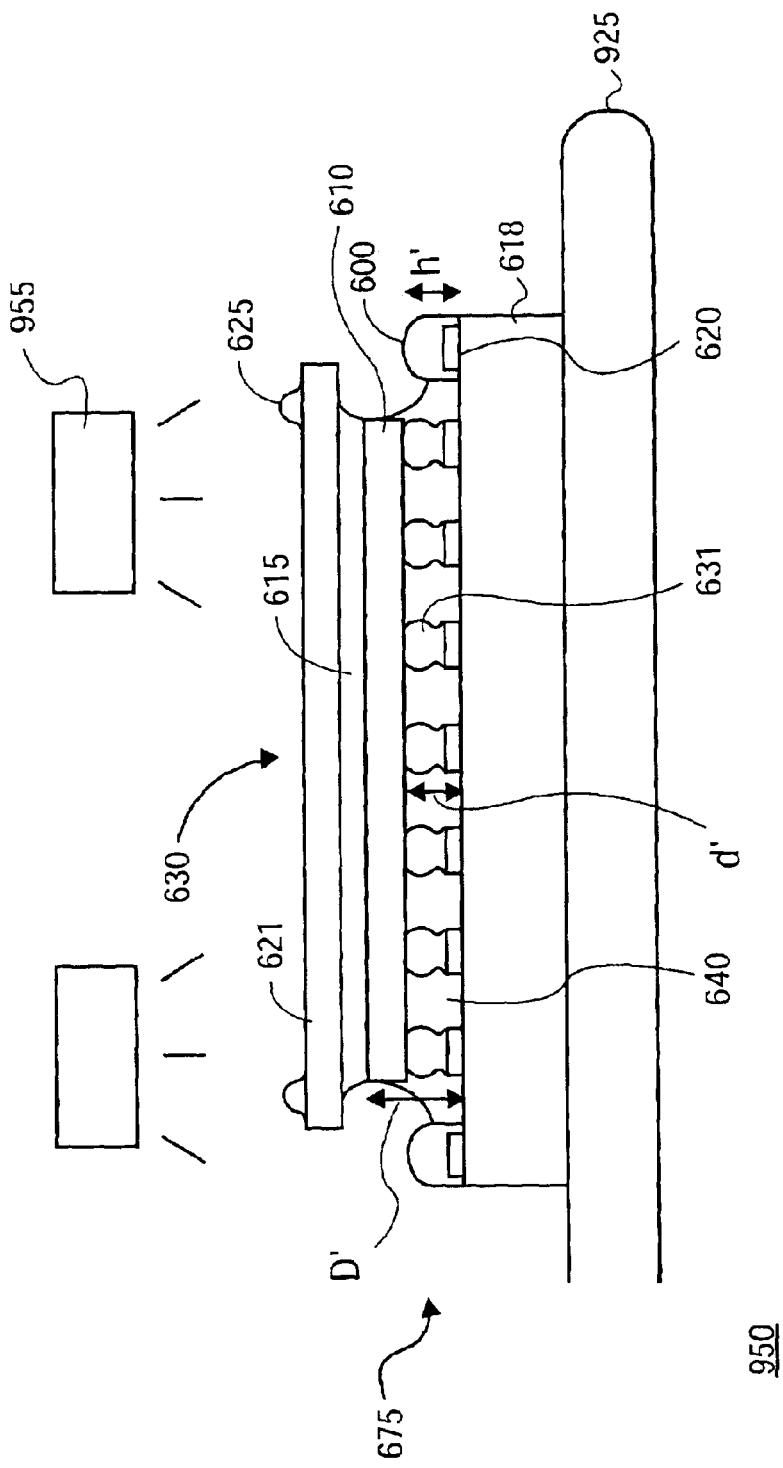
FIG. 9 is a side view of the semiconductor package of FIG. 7 placed within a curing apparatus.

Referring to FIGS. 7–9, methods of forming the removable cover 600 and utilizing the bond fingers 620 are described in detail. Referring to FIG. 7, an embodiment of a package substrate 618 is shown within a dispensing apparatus 750. The package substrate 610 may have multiple layers of circuitry isolated by ILD material. A core material of fiber-reinforced epoxy, copper clad, or other conventional materials may be used to form much of the package substrate 618. Again, the package substrate 618 may be subjected to a photolithographic and metalization process to form bond pads 619 and bond fingers 620. The bond pads 619 and bond fingers 620 may be of a nickel-gold, copper, titanium or other electrically conductive suitable materials.

A material is delivered by a syringe 700 of the dispensing apparatus 750 to form a removable cover 600 for covering and isolating the bond fingers 620. With additional reference to FIGS. 6A and 6B and as described below, the removable cover 600 prevents underfill material 640 from covering the bond fingers 620, leaving at least a portion of the bond fingers 620 free to couple to metal contacts 625 of an upper die 621 once the removable cover 600 is removed.

Continuing with reference to FIG. 7, with added reference to FIGS. 6A and 6B, the removable cover 600 may be of a host of materials selected as a matter of design choice. For example, in one embodiment, described further below, the removable cover 600 is formed of a polymer, such as a polyurethane foam, configured to degrade as underfill material 640 is cured and solidified. In this manner, no additional processing is required to remove the removable cover 600 before coupling the bond fingers 620 to, for example, metal contacts 625 of an upper die 621 as shown in FIG. 6B.

Referring to FIG. 8, the package substrate 618 is shown with removable cover 600 of a given height (h'). The package substrate 618 is placed in a pick and place device 850 where an arm 800 delivers stacked dice 630. As in the embodiment described with reference to FIGS. 1–5, a surface of the stacked dice 630 includes metal bumps 631 to align and couple to the bond pads 619 of the package substrate 618. Again, aligning of the metal bumps 631 and the bond pads 619 prevents the surface of the package substrate 618 from contacting the surface of the stacked dice 630. In this manner, a distance (d') (see FIG. 9) will separate the package substrate 618 and the surface of the stacked dice 630.

Referring to FIGS. 8 and 9, and as described further herein, the height (h') of the removable cover 600, may extend to at least about the distance (d'). This may prevent underfill material 640 from flowing over the bond fingers 620. In one embodiment, the removable covers 600 are between about 50 microns and about 250 microns in height (h').

Continuing with reference to FIG. 8, the stacked dice 630 include a lower die 610 and an upper die 621 having generally independent circuitry as described above with reference to embodiments of FIGS. 1–5. The lower die 610 accommodates the metal bumps 631 referenced above and is coupled to the upper die 621 through an adhesive interface material 615. Metal contacts 625 are located at an upper surface of the upper die 621. Again, the metal contacts 625 are similar to the metal bumps 631. However, they require wire bonding, or some other means to electrically couple to the package substrate 618.

Continuing with reference to FIG. 8, once the stacked dice 630 are delivered to the package substrate 618, conventional soldering is again used to electrically couple the bond pads 619 and the metal bumps 631. In this manner, a semiconductor package 675, as shown in FIG. 9, is formed.

Referring to FIG. 9, the semiconductor package 675 is shown with an underfill material 640 delivered and fills the space between the package substrate 618 and the lower die 610. As described below, the underfill material 640 is cured to physically secure the stacked dice 630 to the package substrate 618. Additionally, in one embodiment, the removable cover 600 deteriorates during curing as the underfill material 640 hardens. This leaves at least a portion of the bond finger 620 void of underfill material 640 and the removable cover 600 such that it may be coupled to a metal contact 625 (as shown in FIG. 6B).

The bond fingers 620 are to be coupled to the metal contacts 625 of the upper die 621. Therefore, as noted above, at least a portion of each bond finger 620 is left uncovered by underfill material 640. This may be accomplished in one embodiment by the formation of a removable cover 600 as described above that includes a height (h') that is as great as the distance (d'). As a result, proper underfill material 640 delivery will not lead to underfill material 640 covering the bond fingers 620. As noted above, this is because, with the possible exception of locations at the side of the lower die 610, the underfill material 640 will not form a profile that is higher than the distance (d'), thus, substantially preventing its coverage of removable cover 600 of the height (h') as described. Embodiments include a distance (d') from about 50 microns to about 100 microns with the removable cover 600 being of a height (h') at least about the distance (d') as described above.

Continuing with reference to FIG. 9, the semiconductor package 675 is shown on a conveyor belt 925 of a curing apparatus 950. The curing apparatus 950 may be a conventional semiconductor bake oven with heating elements 955 to provide RF, microwave, or other forms of radiation to the semiconductor package 675. In one embodiment, curing is activated by heating the curing apparatus 950 and advancing the semiconductor package 675 along the conveyor belt 925.

The exact heating and rate of advancement of the semiconductor package 675 is a matter of design choice depending on the particular curing requirements of the underfill material 640 used. For example, in one embodiment, a conventional underfill material 640 is used which fully cures when exposed to a temperature of between about 160° C. and about 180° C. for between about 1.5 hours and about 3.5 hours. Examples of such underfill materials 640 may include an anhydride or novolac epoxy as noted above. However, alternate underfill materials 640 may be used.

As noted above, one embodiment includes a removable cover 600 of a material configured to degrade during underfill cure. For example, in an embodiment where an anhydride or novolac epoxy underfill material 640 is to be cured as described above, curing may proceed at about 180° C. A polymer such as polyurethane, degradable between about 110° C. and about 200° C., may be configured to degrade at or below 180° C. and used to form the removable cover 600 as described with reference to FIG. 7. For example, a polyurethane in the form of benzyl isocyanide or methyl isocyanide, either degradable below about 180° C., may be used to form the removable cover 600. In this manner, the removable cover 600 may prevent flow of liquid underfill material 640 over the bond fingers 620 prior to curing. However, during curing, as the underfill material 640 solidifies, the removable cover 600 degrades. Thus, uncovered bond fingers 620 remain following underfill cure. This allows the bond fingers 620 to be coupled to the metal contacts 625 as described further below.

In addition to degradation below about 180° C., polyurethane materials may be particularly suited to being dispensed as shown in FIG. 7 in a foam form. Therefore, a removable cover 600 having a height (h') as described herein is readily achieved during delivery to isolate the bond fingers 620. For example, with reference to FIG. 7, monomer precursors of a polyurethane may be mixed in liquid form at the syringe 700, where they begin to react before and during delivery. The reaction forms polyurethane while simultaneously releasing carbon dioxide. As a result, the material forming the removable cover 600 foams as it is delivered. The foam configuration with pockets of carbon dioxide helps to ensure degradation of the removable cover 600 during underfill cure.

As described above, the removable cover 600 is configured to degrade during underfill cure which takes place from between about 1.5 hours and about 3.5 hours at a temperature below about 180° C. However, this is not required. For example, an underfill material 640 may be utilized that cures at a different temperature or over a different amount of time. In one such embodiment, the removable cover 600 is formed of an alternate material, such as an alternate polymer, which degrades at a temperature and over a time period which correlates to the curing parameters of the underfill material 640 used. It is not required that the removable cover 600 degrade during underfill cure as described above. Rather, a material forming the removable cover 600 may degrade at a temperature higher than that needed for underfill material 640 cure. Additionally, materials of the removable cover 600 may take longer to degrade than it takes the underfill material 640 to cure. In such embodiments, the semiconductor package 675 may be exposed to a higher temperature or heated for a longer duration than that required to cure the underfill material 640. In this manner, the removable cover 600 may be degraded following curing as described above. Additionally, the removable cover 600 may be degraded or removed by other appropriate means, such as physical removal, following underfill cure as described above.

Referring to FIG. 6B, the semiconductor package 675 is shown with electrical coupling between the bond fingers 620 and the metal contacts 625 of the upper die 621. As in the embodiments described with reference to FIGS. 1–5, wire bonding with wires 650 may be used to electrically couple the metal contacts 625 and the bond fingers 620. Again, the wires 650 may be of gold or other suitable material.

Continuing with reference to FIG. 9, an alternate embodiment is described. As noted above, locations immediately at the side of the lower die 610 may accommodate a degree of underfill material 640 buildup. Coverage of the removable cover 600 with this portion of the underfill material 640 may be avoided by placing the removable cover 600 and bond finger 620 at a location that is not immediately at the side of the lower die 610.

As in the embodiments described with reference to FIGS. 1–5, an added measure may be taken to ensure that the bond fingers 620 remain uncovered by underfill material 640. For example, in one alternate embodiment, the removable covers 600 are of a height (h') that is at least about a distance (D') from an upper surface of the lower die 610 to the surface of the package substrate 618. In this manner, should a removable cover 600 and bond finger 620 be located so close to the side of the lower die 610 that it may contact underfill material 640 thereat, they will remain substantially uncovered thereby, due to having a profile that meets or exceeds that of the lower die 610 as measured from the upper surface of the lower die 610 to the surface of the package substrate 618. Because the underfill material 640 does not exceed the distance (D') in profile, even immediately at the side of the lower die 610, it does not reach a profile capable of covering removable covers 600 that are of a height (h') that is at least about the distance (D'). Embodiments include a distance (D') from about 150 microns to about 250 microns with the removable covers 600 being of a height (h') at least about the distance (D') as described above.

Figure 10:
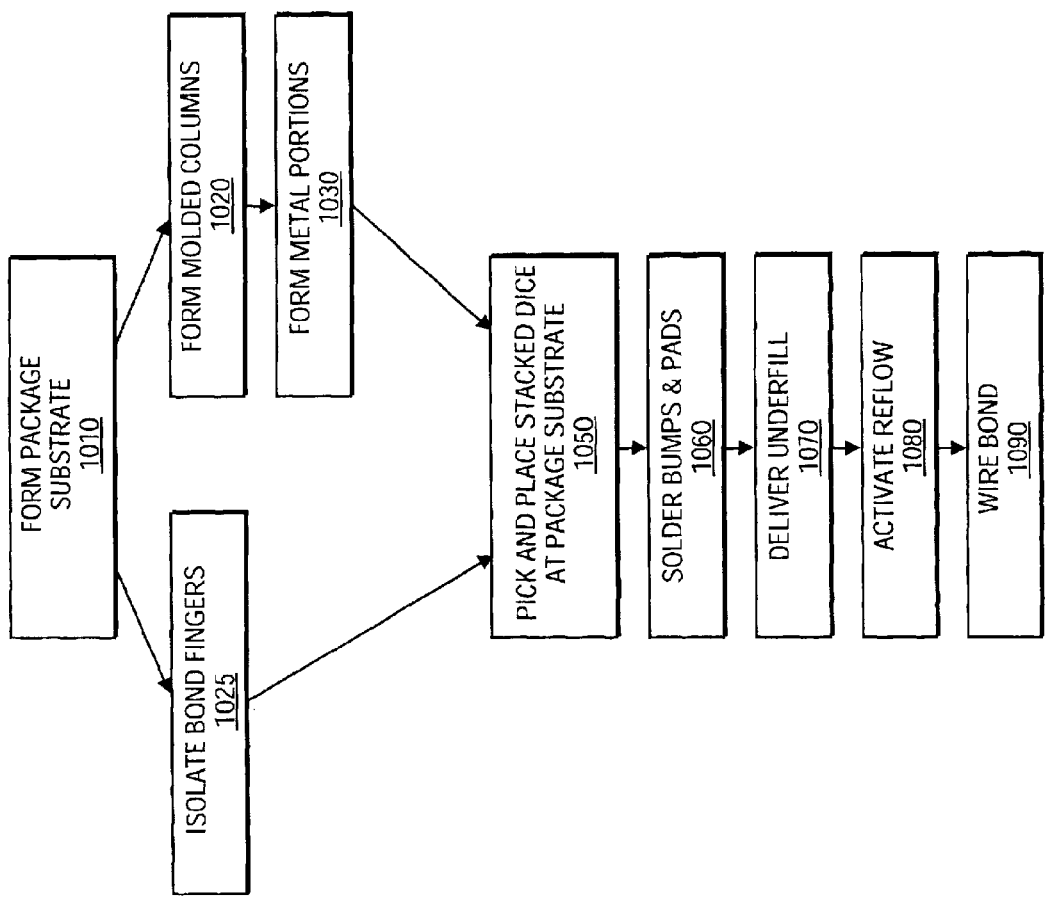
FIG. 10 is a flow-chart summarizing embodiments of forming a semiconductor package including a package substrate having a portion of a finger projection devoid of inter-layer dielectric (ILD) material and wire bonded to stacked dice of the semiconductor package.

Referring to FIG. 10, the above-described embodiments are summarized in the form of a flow chart. The elevated or removably covered bond fingers described with reference to FIGS. 1–9 are referred to in the flow-chart of FIG. 10 by the single term "finger projections". That is, embodiments described with reference to FIG. 1, just as embodiments described with reference to FIGS. 6A and 6B, may be thought of as including finger projections. The finger projections have a first portion to couple to a die (e.g. the metal portion 122 of FIG. 1 or the bond pads 620 of FIGS. 6A and 6B) and another portion to protect the first portion from being covered by underfill material (e.g. such as the molded column 102 of FIG. 1 or the removable cover 600 of FIG. 6A).

With reference to the flow-chart as shown in FIG. 10, a package substrate is formed as shown at block 1010. Bond fingers of the package substrate may then be isolated as shown at block 1025 (e.g. by a removable cover 600 as shown in FIG. 6A). Alternatively, as shown at block 1020, a molded column may be placed adjacent the bond fingers, followed by the build-up formation of metal portions as shown at block 1030 (e.g. such as the metal portions 122 of FIG. 1). In either embodiment, bond fingers will be protected from underfill coverage as described below.

Elevated or removably covered bond fingers, referred to here as finger projections, may now be a part of a package substrate to receive stacked dice as shown at block 1050. Metal bumps of the stacked dice may be soldered to bond pads of the package substrate as shown at block 1060 followed by delivery of underfill material as shown at block

1070. The configuration of the finger projections of either embodiment (e.g. FIG. 1 or FIGS. 6A and 6B), prevents the bond fingers from being covered by the underfill material. Therefore, curing may proceed as indicated at block 1080 followed by wire bonding between the bond fingers and, for example, a die of the stacked dice as shown at block 1090.

Embodiments described above include semiconductor packages, package substrates, and methods, where a bond finger of a package substrate is left uncovered by underfill material when a stacked semiconductor package is to be formed. Thus, underfill material does not impede the coupling of the bond finger to metal contacts of an upper die of stacked semiconductor package.

Embodiments described above include the formation of an elevated or covered bond finger that utilizes a height to allow an electrically conductive portion thereof to remain uncovered by underfill material flow during processing. Additionally, embodiments include the formation of a removable or degradable protective cover to prevent underfill material from flowing over a bond pad during processing. Although exemplary embodiments describe particular bond fingers and features thereof, such as the noted protective cover, additional embodiments are possible. Additionally, many changes, modifications, and substitutions may be made without departing from the spirit and scope of these embodiments.

I claim:

1. An apparatus comprising:
   a package substrate having a surface with underfill material thereat;
   a first die secured to said surface with said underfill material;
   a bond finger coupled to said surface and including a metal portion vertically adjacent a molded column; and
   a second die electrically coupled to said metal portion, said metal portion substantially uncovered by said underfill material; wherein a height of the bond finger is at least great as a distance between said surface and said first die.

2. The apparatus of claim 1 wherein said metal portion includes one of an initial bond finger, an elevated bond portion, and a metalized cap.

3. The apparatus of claim 1 wherein the height of the bond finger is between about 50 microns and about 250 microns.

4. The apparatus of claim 1 wherein said height is between about 50 microns and about 100 microns.

5. An apparatus comprising:
   a package substrate having a surface with an underfill material thereat;
   a first die secured to said surface with said underfill material;
   a bond finger coupled to said surface and covered by a removable cover; and
   a second die coupled to said first die and for coupling to said bond finger, said removable cover to allow said bond finger to remain substantially uncovered by said underfill material.

6. The apparatus of claim 5 wherein said removable cover is of a polymer foam material.

7. The apparatus of claim 5 wherein said removable cover is of a polyurethane material.

8. The apparatus of claim 7 wherein said polyurethane material includes one of a benzyl isocyanide material and a methyl isocyanide material.

9. The apparatus of claim 5 wherein said removable cover is of a height that is between about 50 microns and about 250 microns.

10. The apparatus of claim 9 wherein said surface is a package surface, said first die having a lower surface a distance from said package surface, said height at least about said distance from said package surface.

11. The apparatus of claim 10 wherein said height is between about 50 microns and 100 microns.

12. The apparatus of claim 9 wherein said surface is a package surface, said first die having an upper surface a distance from said package surface, said height at least about said distance from said package surface.

13. The apparatus of claim 12 wherein said height is between about 150 microns and about 250 microns.

14. An apparatus comprising:
    a package substrate having a surface with underfill material thereat;
    a first die secured to said surface with said underfill material;
    a finger projection coupled to said surface and including a first portion and a second portion; and
    a second die electrically coupled to said first portion, said second portion to allow said first portion to remain substantially uncovered by said underfill material;
    wherein a height of at least a part of the first portion from the surface is greater than a thickness of the underfill material.

15. The apparatus of claim 14 wherein said first die is coupled to said second die to form a stacked dice configuration.

16. The apparatus of claim 14 wherein said second die is coupled to said first portion by wire bonding.

17. The apparatus of claim 14 wherein said height is between about 50 microns and about 250 microns.

18. The apparatus of claim 14 wherein said height is between about 50 microns and about 100 microns.

19. The apparatus of claim 14 wherein said height is between about 150 microns and about 250 microns.

20. An apparatus comprising:
    a package substrate having a surface to accommodate an underfill material of a particular thickness for securing a first die; and
    a finger projection coupled to said surface to be coupled to a second die, the finger projection having a height greater than the particular thickness to allow an electrical contact portion of the finger projection to remain substantially uncovered by said underfill material.

21. The apparatus of claim 20 wherein said height is between about 50 microns and about 250 microns.

22. A system comprising:
    a printed circuit board for an electronic device; and
    a semiconductor package coupled to said printed circuit board, said semiconductor package including a substrate surface coupled to a first die with an underfill material and a finger projection having a metal portion electrically couple to a second die;
    wherein the finger projection has a height greater than a thickness of the underfill material.

23. The system of claim 22 wherein the first die is coupled to the second die in a stacked dice configuration.

* * * * *

UNITED STATES PATENT AND TRADEMARK OFFICE
CERTIFICATE OF CORRECTION

PATENT NO. : 6,774,471 B2  Page 1 of 1
DATED : August 10, 2004
INVENTOR(S) : Chee It is certified that error appears in the above-identified patent and that said Letters Patent is hereby corrected as shown below:

Column 1,
Line 48, delete "ran" and insert -- run --.

Signed and Sealed this

Seventh Day of December, 2004

JON W. DUDAS
*Director of the United States Patent and Trademark Office*